United States Patent
Cernasov et al.

(10) Patent No.: US 8,058,876 B2
(45) Date of Patent: Nov. 15, 2011

(54) LOW COST CURRENT AND TEMPERATURE SENSOR

(75) Inventors: Andrei Cernasov, Ringwood, NJ (US); Joseph Marotta, Boonton, NJ (US); Fernando De La Vega, Ridgefield Park, NJ (US)

(73) Assignee: Honeywell International, Inc., Morristown, NJ (US)

( * ) Notice: Subject to any disclaimer, the term of this patent is extended or adjusted under 35 U.S.C. 154(b) by 874 days.

(21) Appl. No.: 12/109,190

(22) Filed: Apr. 24, 2008

(65) Prior Publication Data
US 2009/0315564 A1 Dec. 24, 2009

(51) Int. Cl.
*G01N 27/416* (2006.01)
*G01N 27/82* (2006.01)
*G01R 11/02* (2006.01)

(52) U.S. Cl. ............ 324/426; 324/117 H; 324/137

(58) Field of Classification Search .......... 324/105, 324/117 H, 137, 441, 224, 425, 426; 361/87, 361/93.8
See application file for complete search history.

(56) References Cited

U.S. PATENT DOCUMENTS

| | | | |
|---|---|---|---|
| 6,366,076 B1 | 4/2002 | Karrer et al. | |
| 6,545,456 B1 | 4/2003 | Radosevich et al. | |
| 6,876,189 B2 | 4/2005 | Takatsuka et al. | |
| 7,084,617 B2 | 8/2006 | Ozaki et al. | |
| 7,279,885 B2 * | 10/2007 | Yakymyshyn et al. | ... 324/117 R |
| 7,321,226 B2 | 1/2008 | Yaymyshyn et al. | |
| 7,332,903 B2 | 2/2008 | Hausperger | |
| 7,358,716 B2 * | 4/2008 | Preusse et al. | ............ 324/117 R |
| 7,615,986 B2 * | 11/2009 | Nomoto et al. | ........... 324/117 H |
| 2005/0077890 A1 | 4/2005 | Rannow et al. | |
| 2008/0013597 A1 | 1/2008 | Mikuni et al. | |
| 2008/0030208 A1 | 2/2008 | Aratani | |
| 2008/0048662 A1 | 2/2008 | Hirsch | |

* cited by examiner

*Primary Examiner* — Richard V Muralidar
(74) *Attorney, Agent, or Firm* — Miriam Jackson, Esq.

(57) ABSTRACT

A battery health or prognosis system may employ a ferrite disc embedded in a printed wiring board (PWB) to perform both a battery current sensing role and a temperature sensing role. The ferrite disc may be surrounded with a coil that may be comprised of surface conductors and electrically conductive vias of the PWB. Excursions of coil current may be produced to generate observable hysterisis loops in the ferrite disc. The generated hysterisis loops may be compared to a temperature-dependent family of hysterisis loops for the magnetic material from which the ferrite disc is constructed. A processor mounted on the PWB may collect and process outputs from a Hall-effect sensor to develop both temperature and battery current information to produce a prognosis for the battery.

20 Claims, 5 Drawing Sheets

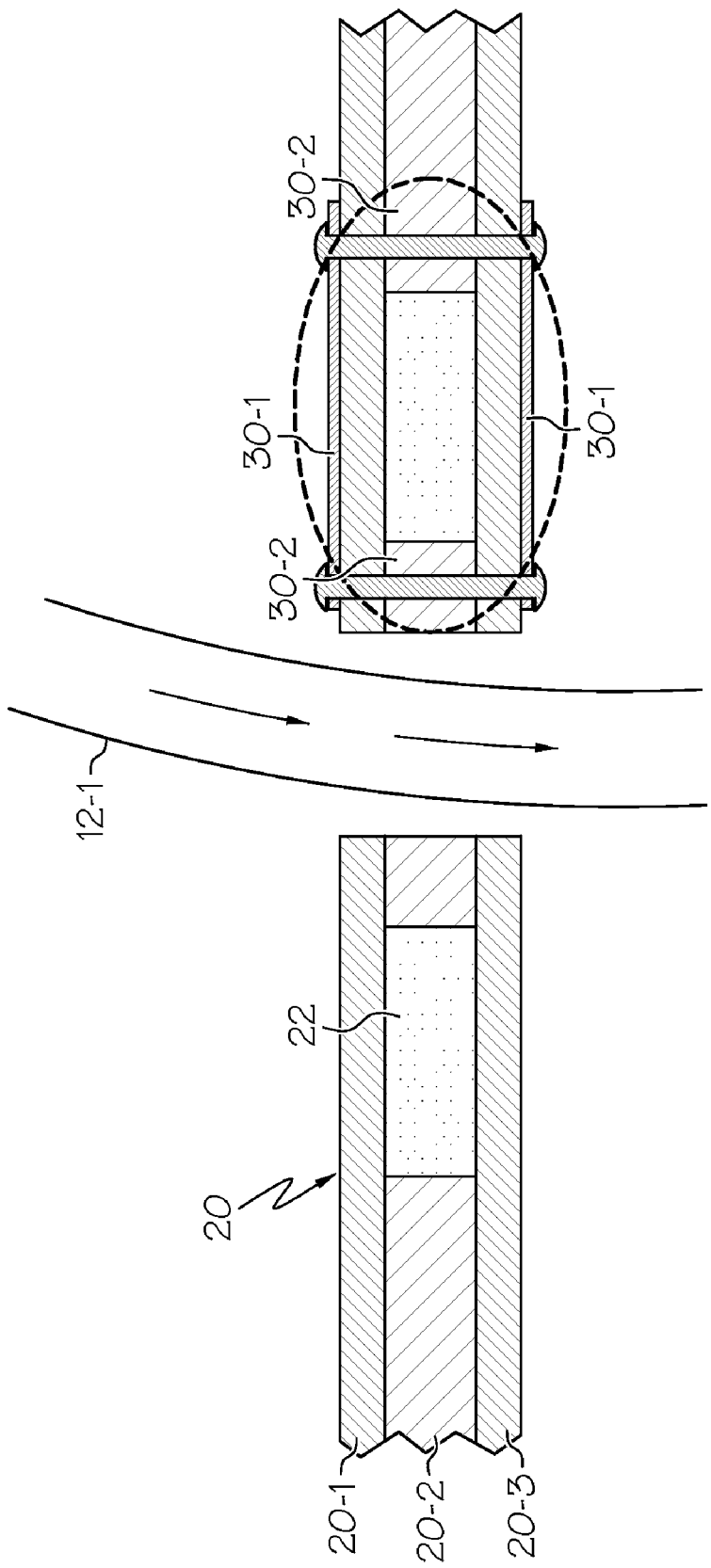

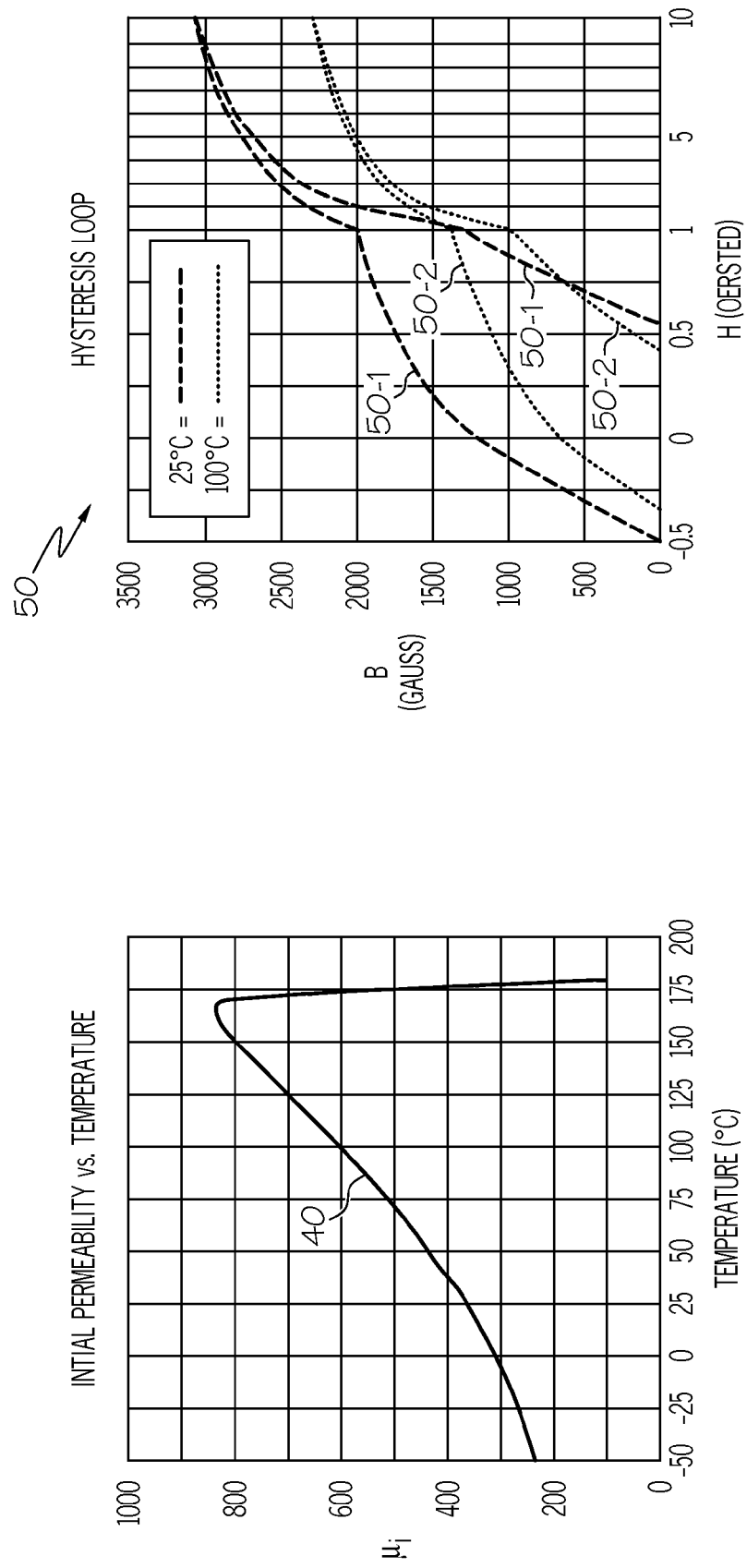

LOW COST CURRENT AND TEMPERATURE SENSOR

BACKGROUND OF THE INVENTION

The present invention is generally in the field of assessment of condition of batteries and, more particularly, systems for sensing current to and from a battery over a period of time and for sensing temperature at which the current occurs.

In some applications of batteries, such as automotive and aircraft power systems, a battery may provide continuous power at a low rate for some control systems. The same battery may also provide power at a high current rate for limited times for tasks such as engine starting. The battery may be in place within a vehicle for an extended time, during which time the vehicle may be exposed to varying environmental temperature. Recharging batteries may occur at low, so-called trickle rates and also at high current rates.

A battery may have only a limited useful lifetime. Its useful lifetime may be limited by factors such as times and rates of discharge, times and rates of re-charge and amounts of time that a battery may be exposed to various temperatures. In particular, exposing a battery to low temperature may have the effect of shortening its useful lifetime.

In many battery applications, battery health systems or prognosis systems may be employed to predict or determine if a battery may be capable of performing its high current tasks, such as engine starting, when needed. These prognosis systems may continuously collect data relating to rates of current discharge and/or re-charge and time periods over which these current rates occurred. Additionally, a typical battery prognostic system may continually collect data relating to times that a battery is exposed to any particular temperature. Such data may then be processed to provide a prediction of future useful life of the battery.

In the past, battery prognosis systems were employed only in specialized vehicles such as high-risk military vehicles. As automotive and aircraft electrical system designs have evolved, battery prognosis systems are often used on more conventional vehicles such as civilian automobiles. In this regard, battery prognosis systems are being employed in ever increasing volumes. Consequently, manufacturing cost for such systems becomes an increasingly important consideration.

Prior-art vehicular-battery prognosis systems may employ a current sensor and a separate temperature sensor. Use of two different sensors contributes to high cost and complexity of such prognosis systems. There are known techniques for measuring current and temperature with a single sensor (e.g. US Patent Application Publication 2005/0077890, R. Rannow et al). These known techniques, while combining two sensing functions in a single device, are nevertheless complex and expensive. As a result, these single sensor current/temperature measurement systems have not been employed in prior-art vehicular battery prognosis systems.

Additionally, prior-art battery prognosis systems have employed sensors which are separate from processors and controls. In a typical prior-art system, a printed wiring board (PWB) may support processing and control functions while sensors are provided as devices separate from the PWB.

As can be seen, there is a need to provide a battery prognosis system that may be produced at a low cost. Additionally there is a need to provide a system in which current sensing and temperature sensing may be combined in a single low cost device. Still further there is a need to provide such a system in which a sensor is integrated into a PWB on which processing and control is performed.

SUMMARY OF THE INVENTION

In one aspect of the present invention, apparatus for determining battery prognosis comprises a ferrite disc having an axial opening through which a current carrying conductor of the battery passes, a Hall-effect sensor interposed within the ferrite disc, a coil surrounding the disc, a unit for varying current in the coil to produce observable variations in temperature dependent magnetic properties of the disc, and a processor for continually analyzing signals from the Hall-effect sensor to determine current in the conductor and to determine temperature as a function of variations in magnetic properties of the disc.

In another aspect of the present invention, a battery condition detector comprises a PWB through which a conductor of the battery current passes, a ferrite disc surrounding the conductor of the battery, a coil surrounding the ferrite disc, a coil-current unit for varying current in the coil, a sensor producing an output that varies as function of the varying current in the coil and a processor comprising stored reference data relating to temperature dependent magnetic properties of the ferrite disc. The ferrite disc, the coil, the coil-current unit, the sensor and the processor are attached to the PWB. The processor receives varying output from the sensor responsive to the varying current in the coil; and compares the varying output from the sensor with the stored reference data to determine a temperature of the ferrite disc.

In still another aspect of the present invention, a method for producing a prognosis for a battery comprises the steps of passing current from the battery though an opening in a ferrite disc, sensing magnetic reaction to the current from the battery, varying current in a coil surrounding the ferrite disc, sensing temperature-dependent magnetic reaction to the varying coil current, comparing the sensed magnetic reaction to coil current with processor-stored magnetic property data for the ferrite disc to determine temperature of the ferrite disc, and processing the determined temperature with the sensed magnetic reaction to battery current to produce a prognosis of the battery.

These and other features, aspects and advantages of the present invention will become better understood with reference to the following drawings, description and claims.

BRIEF DESCRIPTION OF THE DRAWINGS

FIG. 3 is a sectional view of the battery prognosis system of FIG. 2 taken along the section line 3-3 in accordance with the present invention;

FIG. 4 is a graph portraying a relationship between initial permeability and temperature for a magnetic material in accordance with the present invention;

FIG. 5 is a graph portraying a family of hysterisis loops for a magnetic material in accordance with the present invention.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention may be useful in determining a state of health of an aircraft or automotive battery. More particularly, the present invention may provide a low-cost battery prognosis system. The present invention may be particularly useful in vehicles such as aircraft or automotive vehicles which produce a continuous drain on a battery even when the vehicle is not in an operating mode.

In contrast to prior-art battery prognosis systems, which employ a first sensor for current and a second separate sensor for temperature, the present invention may provide a single low cost sensor for current and temperature. The present invention may employ a single sensing unit embedded in a printed wiring board to simultaneously determine current to and from the battery as well as a temperature at which such current occurs. Additionally, the present invention may provide a prognosis system in which processor, control and sensing functions may be incorporated on a single PWB, whereas prior-art prognosis systems are typically not integrated onto a single PWB.

Figure 1:
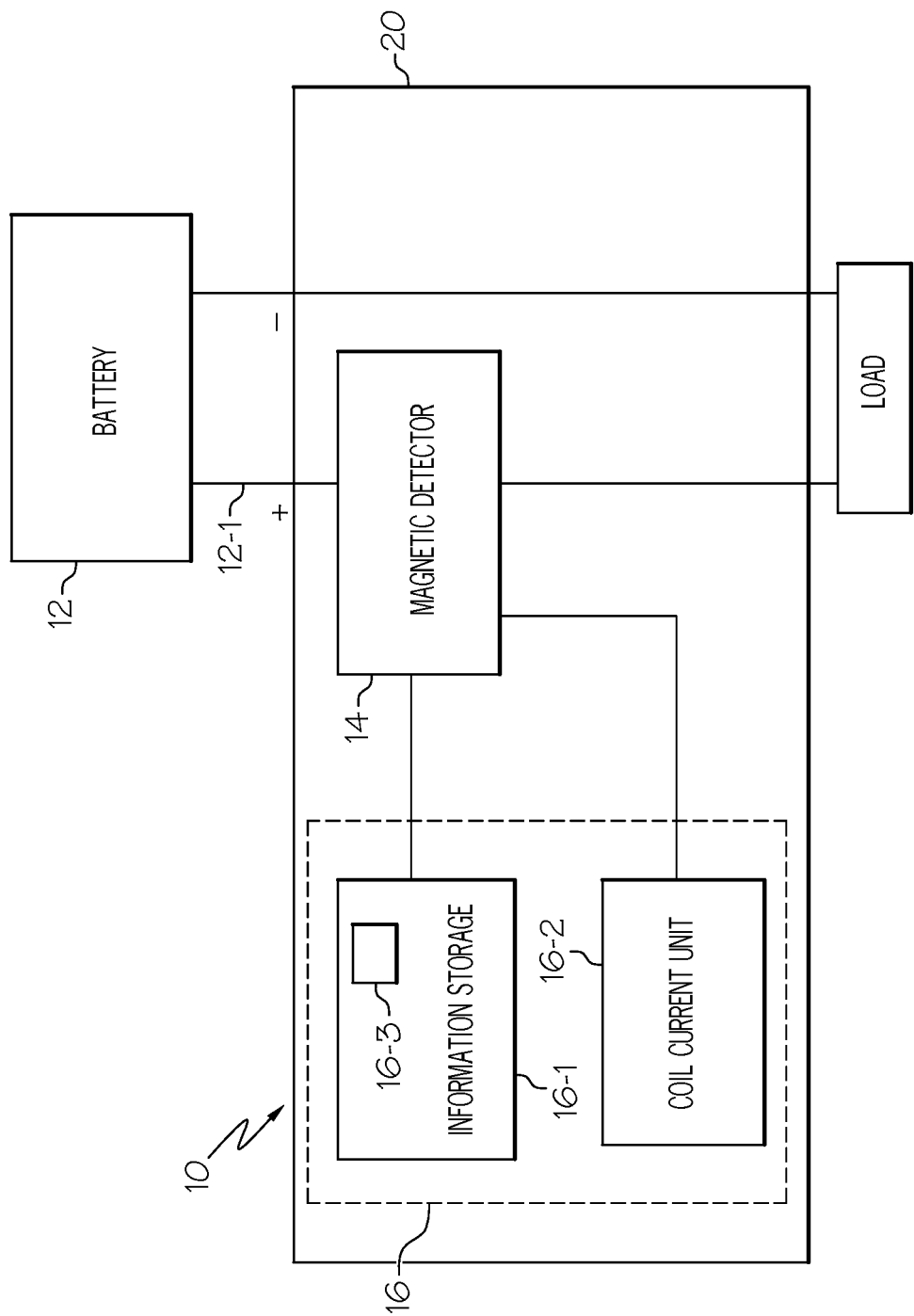
FIG. 1 is a block diagram of a battery prognosis system in accordance with the present invention.

Referring now to FIG. 1, there is shown, in block diagram form, a battery condition detector or prognosis system 10 for a battery 12. The system 10 may comprise a magnetic detector 14 and a processor 16. The processor 16 may comprise an information storage unit 16-1 and a coil current unit 16-2. A look-up table 16-3 may be incorporated into the processor 16. The system 10, in an illustrative embodiment, may be constructed on a printed wiring board (PWB) 20. In operation, the system 10 may employ the magnetic detector 14 to continually sense data relating to current in a conductor 12-1 of the battery 12. Additionally, the magnetic detector 14 may be employed to sense temperature data relating to a temperature of an environment in which the battery 12 may be located. Sensed temperature and current data may be collectively processed in the processor 16 to provide a continuous prognosis of the battery 12.

Figure 2:
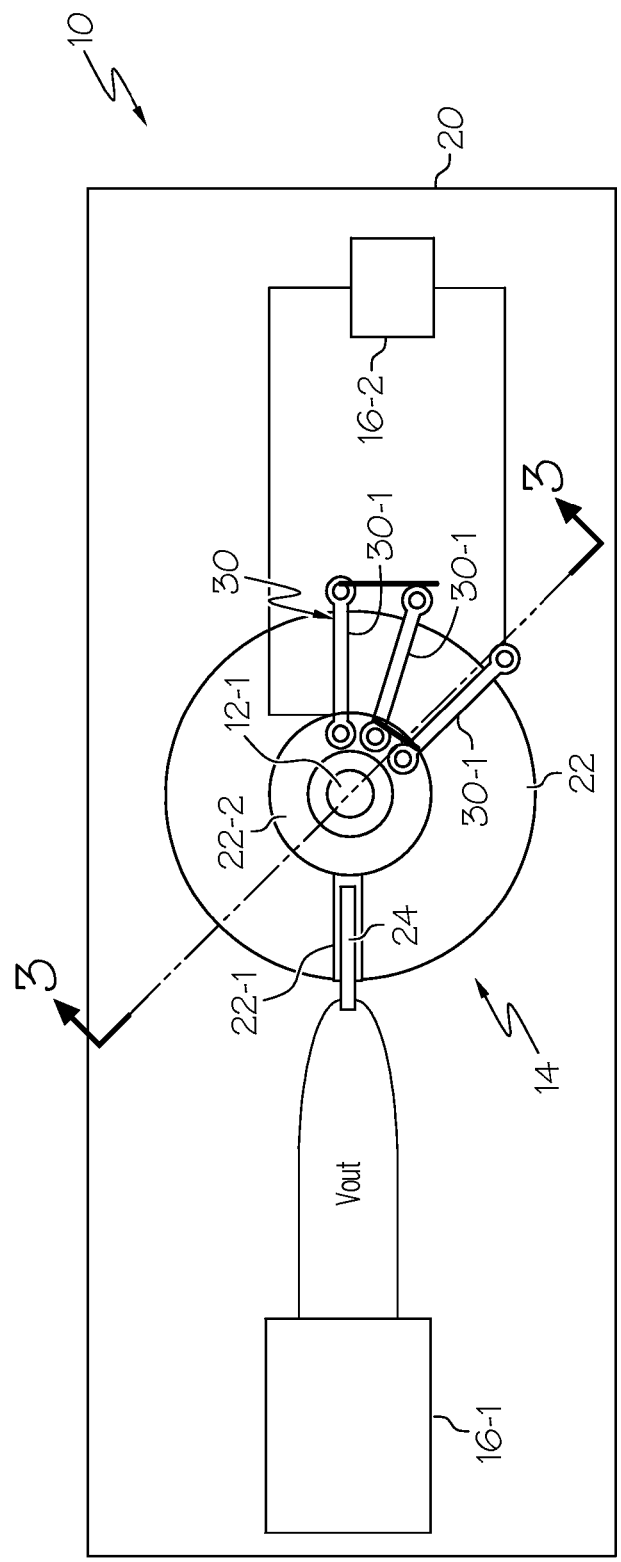
FIG. 2 is a schematic plan view of the battery prognosis system of FIG. 1 in accordance with the present invention.

Referring now to FIGS. 2 and 3, detailed view of the magnetic detector 14 may be seen. The magnetic detector 14 may comprise a ferrite disc 22 which, in an illustrative embodiment, may be embedded within multiple layers 20-1, 20-2 and 20-3 of the PWB 20. A Hall-effect sensor 24 may be positioned within a slot 22-1 formed in the ferrite disc 22. The PWB 20 may be positioned so that the conductor 12-1 of the battery 12 may pass through an axial opening 22-2 in the ferrite disc 22.

A coil 30 may surround the ferrite disc 22. The coil 30 may comprise surface conductors 30-1 which may be printed on the PWB 20. Electrical Interconnections between the surface conductors 30-1 may be provided with electrically conductive vias 30-2 formed in the PWB 20. The coil 30 may be connected to the coil current unit 16-2. For purposes of simplicity, the coil 30 of FIGS. 2 and 3 is shown with only a few turns around the ferrite disc 22. It may be readily understood that the coil 30 may comprise any number of turns within the scope of the present invention.

As current passes through the conductor 12-1, magnetic field strength in the ferrite disc 22 may vary as a function of magnitude and direction of the current. Current magnitude and direction may be sensed by the Hall-effect sensor 24. Data relating to current magnitude and direction may be transmitted to the storage unit 16-1 of the processor 16.

Additionally, magnetic flux density in the ferrite disc 22 may vary as a function of temperature to which the ferrite disc 22 may be exposed. A functional relationship between magnetic flux density and temperature may be determined for any particular magnetic material by observing a relationship between initial permeability and temperature for the material (See FIG. 4). In the case of the present invention, magnetic material may be ferrite with a non-linear relationship between initial permeability and temperature.

Referring now to FIG. 5, a graph 50 may portray various hysterisis loops for a non-linear ferrite material. A first loop 50-1 may portray how magnetic flux density in gauss (B) may vary with respect to magnetic field strength in oersted (H) at a temperature of 25° C. A second loop 50-2 may portray how B may vary with H at a temperature of 100° C. For any particular ferrite material that may be employed for the ferrite disc 22, a family of such hysterisis loops may be determined and recorded in the processor 16 (e.g. in the look-up table 16-3).

Referring now to FIGS. 2, 3 and 5 it may be understood how current and temperature may be measured with the ferrite disc 22 and the Hall-effect sensor 24. The coil current unit 16-2 may produce a bias current in the coil 30 so that the ferrite disc 22 does not become saturated from an overly large current in the conductor 12-1. The magnitude and direction of the bias current may be determined as function of the magnitude and direction of current passing through the conductor 12-1.

In addition to providing a base bias current, the coil current unit 16-2 may produce brief current excursions. For example, if the coil current unit 16-2 were producing a base bias current at 1 ampere, the unit 16 may produce periodic current excursions of about plus and minus 0.1 amperes around the 1 ampere base bias current. Referring now particularly to FIG. 5, it may be seen that a current excursion may produce corresponding magnetic field strength changes and a resultant magnetic flux excursion in the ferrite disc 22. Magnetic field strength H and magnetic flux density B may change in a predictable manner as a function of temperature (see for example graph lines 50-1 for a temperature of 25° C.). In other words, the current excursion produced by the coil current unit 16-2 may produce an observable hysterisis loop.

The Hall-effect sensor 24 may vary its output responsively to the hysterisis loop and the processor 16 may translate the varied output into temperature data (e.g., by comparing sensed output of the Hall-effect sensor 24 with the look-up table 16-3 in the processor 16).

The present invention may be performed with inexpensive and readily available ferrite materials. Inexpensive ferrite materials typically have a high degree of non-linearity between permeability and temperature. This non-linearity may make inexpensive ferrites undesirable for many applications. But the converse is true in the case of the present invention in that non-linearity is a desirable feature of the ferrite disc 22. Low-cost ferrites may be employed and the prognosis system 10 may be produced at a low cost.

Additionally, incorporation of the ferrite disc 22 into the PWB 20 may contribute to lowering of cost of the prognosis system 10 as compared to prior-art systems which may not be integrated on a single PWB. As described above, the processor 16, and the magnetic detector 14 may be incorporated into a single one of the PWB's 20.

Figure 6:
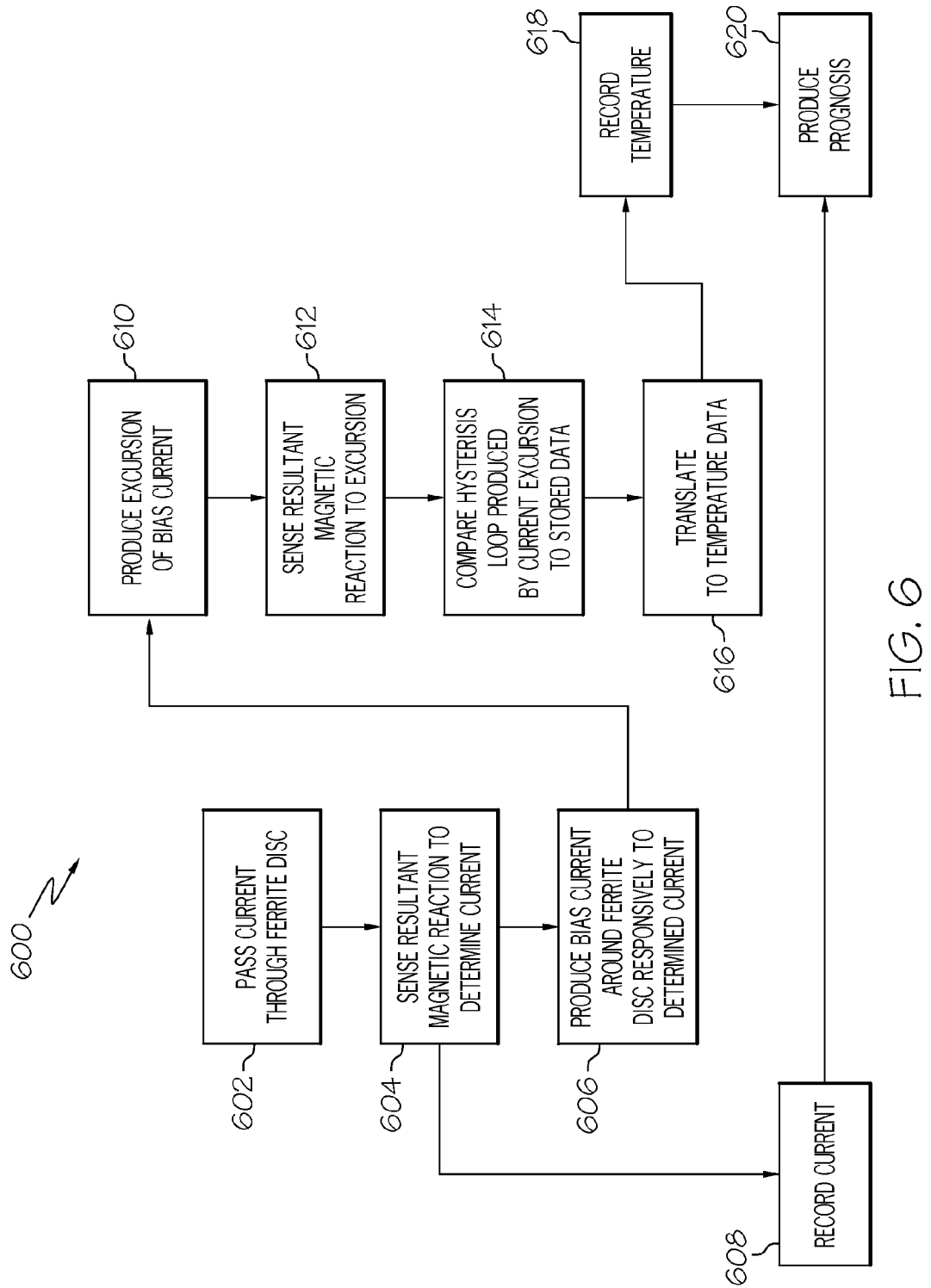
FIG. 6 is a flow chart of a method for providing a battery prognosis in accordance with the present invention.

In one embodiment of the present invention, a method 600 is provided for determining a prognosis of a battery. Referring now to FIG. 6, it may be seen that in a step 602, battery current may be passed through a ferrite disc (e.g., current from the battery 12 may pass through the conductor 12-1 which may be positioned in the axial opening 22-1 of the ferrite disc 22). In a step 604, a resultant magnetic reaction to the current of step 602 may be sensed (e.g., the Hall-effect sensor 24 may respond to variations in magnetic field of the ferrite disc 22).

In a step 606, a bias current may be produced to preclude saturation of the ferrite disc (e.g., the coil current unit 16-2 may produce a base bias current in the coil 30 to prevent saturation of the ferrite disc 22). In a step 608, current sensed in step 604 may be recorded (e.g., the current data from the Hall-effect sensor 24 may be recorded in the processor 16).

In a step 610, a current excursion may be produced in the bias current produced in step 606 (e.g., the coil current unit 16-2 may vary the bias current to a value slightly higher and then slightly lower than a base bias current). In a step 612, a magnetic reaction to the bias current excursion of step 610 may be sensed (e.g., with the Hall-effect sensor 24). In a step 614, A hysterisis loop produced by the bias current excursion of step 610 may be compared to magnetic data of the ferrite (e.g., the processor 16 may compare a resultant hysterisis loop such as 50-1 with the look-up table 16-3 that may contain stored hysterisis loops for the ferrite material from which the ferrite disc 22 is composed). In a step 616, the comparison result of step 614 may be translated into temperature data (e.g., in the processor 16.

In a step 618 the temperature determined in the step 616, may be recorded (e.g., in the processor 16). In a step 620 a battery prognosis may be produced, in a conventional manner, with data provided in steps 608 and 618 (e.g., in the processor 16).

It should be understood, of course, that the foregoing relates to exemplary embodiments of the invention and that modifications may be made without departing from the spirit and scope of the invention as set forth in the following claims.

We claim:

1. Apparatus for determining battery prognosis comprising:
   a ferrite disc having an axial opening through which a current carrying conductor of the battery passes;
   a Hall-effect sensor interposed within the ferrite disc;
   a coil surrounding the disc;
   a unit for varying current in the coil to produce observable variations in temperature-dependent magnetic properties of the disc; and
   a processor for continually analyzing signals from the Hall-effect sensor to determine current in the conductor and to determine temperature as a function of variations in magnetic properties of the disc.

2. The apparatus of claim 1 further comprising:
   a single printed wiring board (PWB); and
   wherein the ferrite disc, the Hall-effect sensor, the coil, the unit for varying current and the processor are integrated on the single PWB.

3. The apparatus of claim 2 further wherein the ferrite disc is embedded within multiple layers of the PWB.

4. The apparatus of claim 2 wherein the coil comprises:
   surface conductors printed on the PWB; and
   electrically conductive vias interposed between the surface conductors.

5. The apparatus of claim 1 wherein the unit for varying current in the coil produces bias current in the coil.

6. The apparatus of claim 5:
   wherein the bias current is a base bias current large enough to preclude saturation of the disc from current in the conductor of the battery;
   wherein the unit for varying current in the coil also produces current excursions around the base bias current; and
   wherein the current excursions produce the observable variations in magnetic properties of the disc.

7. The apparatus of claim 6 wherein an observable magnetic property of the disc comprises a hysterisis loop.

8. The apparatus of claim 1 wherein the ferrite disc has an initial permeability that is related to temperature in a non-linear relationship.

9. A battery condition detector comprising:
   a PWB through which a conductor of the battery current passes;
   a ferrite disc surrounding the conductor of the battery;
   a coil surrounding the ferrite disc;
   a coil-current unit for varying current in the coil;
   a sensor producing an output that varies as function of the varying current in the coil;
   a processor comprising stored reference data relating to temperature dependent magnetic properties of the ferrite disc;
   the ferrite disc, the coil, the coil-current unit, the sensor and the processor being attached to the PWB;
   the processor receiving varying output from the sensor responsive to the varying current in the coil; and
   the processor comparing the varying output from the sensor with the stored reference data to determine a temperature of the ferrite disc.

10. The detector of claim 9 wherein the temperature of the ferrite disc corresponds to temperature of the battery.

11. The detector of claim 9 wherein output of the sensor also varies as function of current in the conductor of the battery.

12. The detector of claim 11 wherein the processor produces a prognosis of the battery as a function of current in the conductor and temperature of the battery.

13. The detector of claim 9 wherein the ferrite disc is embedded within multiple layers of the PWB.

14. The detector of claim 13 wherein the coil comprises surface conductors and vias of the PWB.

15. A method for producing a prognosis for a battery comprising the steps of:
   passing current from the battery though an opening in a ferrite disc;
   sensing magnetic reaction to the current from the battery;
   varying current in a coil surrounding the ferrite disc;
   sensing temperature-dependent magnetic reaction to the varying coil current;
   comparing the sensed magnetic reaction to coil current with processor-stored magnetic property data for the ferrite disc to determine temperature of the ferrite disc; and
   processing the determined temperature and the sensed magnetic reaction to battery current to produce a prognosis of the battery.

16. The method of claim 15 wherein the step of varying current in the coil comprises producing a current excursion that results in a hysterisis excursion in the ferrite disc.

17. The method of claim 16 wherein the step of varying current in the coil also comprises producing a base bias current that precludes saturation of the ferrite disc from the battery current.

18. The method of claim 17 wherein the current excursion comprises an excursion around the base bias current.

19. The method of claim 15 wherein the sensed magnetic reaction to coil current is a hysterisis loop.

20. The method of claim 19 wherein the processor-stored magnetic property data for the ferrite disc comprises a plurality of temperature-dependent hysterisis loops for the ferrite disc.

* * * * *